US009773651B2

(12) United States Patent
Okabe et al.

(10) Patent No.: US 9,773,651 B2
(45) Date of Patent: Sep. 26, 2017

(54) HIGH-PURITY COPPER SPUTTERING TARGET

(71) Applicant: JX Nippon Mining & Metals Corporation, Tokyo (JP)

(72) Inventors: Takeo Okabe, Ibaraki (JP); Tomio Otsuki, Ibaraki (JP); Shigeru Watanabe, Ibaraki (JP)

(73) Assignee: JX Nippon Mining & Metals Corporation, Tokyo (JP)

(*) Notice: Subject to any disclaimer, the term of this patent is extended or adjusted under 35 U.S.C. 154(b) by 295 days.

(21) Appl. No.: 14/370,225

(22) PCT Filed: Dec. 25, 2012

(86) PCT No.: PCT/JP2012/083396
§ 371 (c)(1),
(2) Date: Jul. 2, 2014

(87) PCT Pub. No.: WO2013/105424
PCT Pub. Date: Jul. 18, 2013

(65) Prior Publication Data
US 2014/0367253 A1 Dec. 18, 2014

(30) Foreign Application Priority Data
Jan. 12, 2012 (JP) ................................ 2012-003781

(51) Int. Cl.
*H01J 37/34* (2006.01)
*C23C 14/34* (2006.01)
(Continued)

(52) U.S. Cl.
CPC ............ *H01J 37/3426* (2013.01); *C22C 9/00* (2013.01); *C22F 1/08* (2013.01); *C23C 14/3414* (2013.01)

(58) Field of Classification Search
CPC .... C23C 14/3414; H01J 37/3426; C22C 9/00; C22F 1/08
See application file for complete search history.

(56) References Cited

U.S. PATENT DOCUMENTS 5,155,063 A 10/1992 Ito
5,456,815 A 10/1995 Fukuyo et al.
(Continued)

FOREIGN PATENT DOCUMENTS

JP 2001-107227 A 4/2001
JP 2002-121662 A 4/2002

*Primary Examiner* — Michael Band
(74) *Attorney, Agent, or Firm* — Howson & Howson LLP

(57) ABSTRACT

A high-purity copper sputtering target, wherein a Vickers hardness of a flange part of the target is in a range of 90 to 100 Hv, a Vickers hardness of an erosion part in the central area of the target is in a range of 55 to 70 Hv, and a crystal grain size of the erosion part is 80 μm or less. This invention relates to a high-purity copper sputtering target that does not need to be bonded to a backing plate (BP), and aims to provide a high-purity copper sputtering target capable of forming a thin film having superior uniformity by enhancing a strength (hardness) of the flange part of the target, and reducing an amount of warpage of the target. Moreover, the uniformity of the film thickness is improved by adjusting the (111) orientation ratio of the erosion part and the flange part in the target. The present invention thereby aims to provide a high-purity copper sputtering target, which is capable of improving the yield and reliability of semiconductor products that are being subject to further miniaturization and higher integration, and useful for forming a copper alloy wiring for semiconductors.

9 Claims, 1 Drawing Sheet

20~50mm
Flange Part

Erosion Part

20~50mm
Flange Part

(51) Int. Cl.

| | |
|---|---|
| ***C22C 9/00*** | (2006.01) |
| ***C22F 1/08*** | (2006.01) |

(56) References Cited

U.S. PATENT DOCUMENTS

| | | | | |
|---|---|---|---|---|
| 6,451,135 | B1 | 9/2002 | Takahashi et al. | |
| 6,605,199 | B2 | 8/2003 | Perry et al. | |
| 6,605,497 | B2 | 8/2003 | Yamazaki et al. | |
| 6,896,748 | B2 * | 5/2005 | Perry .................. | C23C 14/3414<br>148/432 |
| 8,551,267 | B2 | 10/2013 | Miao et al. | |
| 2004/0016635 | A1 | 1/2004 | Ford et al. | |
| 2004/0072009 | A1 | 4/2004 | Segal et al. | |
| 2007/0251818 | A1 | 11/2007 | Yi et al. | |
| 2009/0057139 | A1 | 3/2009 | Fukushima et al. | |
| 2011/0139615 | A1 | 6/2011 | Tatsumi et al. | |
| 2011/0163447 | A1 | 7/2011 | Fukushima et al. | |
| 2011/0203916 | A1 | 8/2011 | Wang | |
| 2014/0318953 | A1 | 10/2014 | Nagata et al. | |
| 2016/0071705 | A1 | 3/2016 | Tsukamoto | |

* cited by examiner

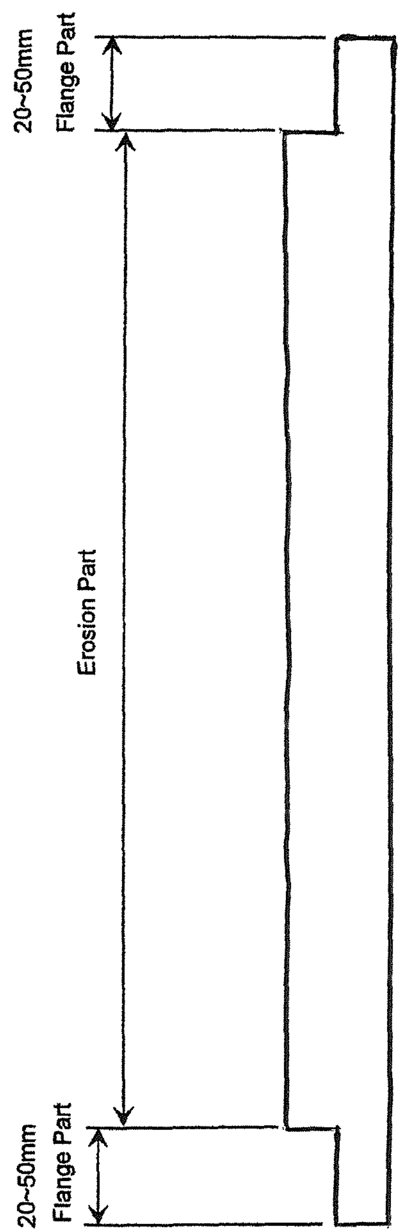
20~50mm
Flange Part
Erosion Part
20~50mm
Flange Part

HIGH-PURITY COPPER SPUTTERING TARGET

BACKGROUND

The present invention provides a high-purity copper sputtering target with minimal deformation during sputtering and high utilization efficiency, and in particular relates to a high-purity copper sputtering target which is useful for forming a copper alloy wiring for semiconductors.

Conventionally, while an Al alloy (specific resistance of roughly 3.0 μΩ·cm) has been used as the wiring material of a semiconductor device, pursuant to the miniaturization of wirings, a copper wiring with lower resistance (specific resistance of roughly 2.0 μΩ·cm) has been put into practical application. As the process for forming a copper wiring, generally adopted is the method of forming a diffusion barrier layer made of Ta or TaN on a wiring or a wiring groove, and thereafter subjecting copper to sputter deposition. High-purity copper of 5N to 6N is normally produced by performing wet or dry purification to electrolytic copper having a purity level of 4N (excluding gas components) as the crude metal, and this is being used as a sputtering target.

As described above, a Cu wiring is now being used pursuant to the higher performance of devices, and the usage ratio thereof is anticipated to continue increasing in the future. Meanwhile, in order to reduce costs, there are great demands for improving the utilization efficiency, and an integrated target is optimal for meeting such demands. Nevertheless, the input power of sputtering is extremely high in recent years, and the problem of deformation is being pointed out.

With a target having a wafer diameter of 300 mm, since the input power is high, a high-strength copper alloy is being used as a backing plate (cooling plate; hereinafter referred to as "BP") for preventing the deformation of the target during its use. Thus, while the amount of deformation can be suppressed, due to the existence of the BP, the target needs to be formed thinner by that much, and the utilization efficiency of the target will thereby deteriorate.

Moreover, based on a concept that is similar to the integrated target proposed in the present invention, there is also a method of increasing the strength by introducing strain based on ECAE (Equal Channel Angular Extrusion). Nevertheless, with this method, there is a problem in that the main orientation of the sputtering part of the target will also be the (220) orientation that has strain, and this affects the film thickness uniformity.

Upon reviewing the conventional technologies, Patent Document 1 below proposes an integrated target (monolithic target) configured from tantalum, niobium, cobalt, titanium and valve metal, and comprises a flange with an enlarged diameter which is bolted to a coolant (BP). Patent Document 1 further describes giving proof stress and rigidity to the flange part by way of cold working and other processes. While the purpose thereof is unclear, it is assumed that the strength is increased in order to bolt the flange part to the BR Nevertheless, the purpose and details of such increased strength are unclear.

Patent Document 2 below describes integrating a target and a backing plate with a soft metal material made of Al or Al alloy in light of the fact that the mechanical strength of a target made from Al, Al—Ti, or Al—Cr is weak, and proposes suppressing, based on the water pressure of the cooling water, the occurrence of water leakage and abnormal discharge caused by the warpage of the overall target.

In the foregoing case, since Patent Document 2 is based on the premise of the integration of the target and the backing plate, inferiority in terms of conventional utilization efficiency is inevitable.

Patent Document 3 below describes integrating a target and a backing plate with a soft metal material made of Al alloy and further performing cold plastic working thereto in order to cause the micro Vickers hardness to be 36 or higher in light of the fact that the mechanical strength of a target made from Al—Ti, or Al—Cr is weak. In addition, Patent Document 3 proposes suppressing, based on the water pressure of the cooling water, the occurrence of water leakage and abnormal discharge caused by the warpage of the overall target.

In the foregoing case, since Patent Document 3 is based on the premise of the integration of the target and the backing plate, inferiority in terms of conventional utilization efficiency is inevitable. As another reference example (refer to Patent Document 4), there is a sputtering target containing copper in an amount of at least 99.99% by weight, having an average grain size of at least 1 to 50 micrometers, and having a yield strength of approximately 15 ksi or more.

Generally speaking, upon producing a high-purity copper sputtering target, a melted and cast copper ingot is processed into a target shape of a predetermined dimension, and the surface thereof is machined to produce the sputtering target.

In the foregoing case, deformation of the target material needs to be suppressed. When the deformation of the target is minimal, the smoothness of the surface can be maintained, and a thin film with superior uniformity can be formed. Nevertheless, there is no conventional technology that has developed a high-purity copper sputtering target material with the intent of suppressing the deformation of the target without using a backing plate, and improving the utilization efficiency of the target.

Patent Document 1: JP 2005-533930 A
Patent Document 2: JP 2001-107227 A
Patent Document 3: JP 2002-121662 A
Patent Document 4: JP 2005-533187 A

SUMMARY

The present invention relates to a high-purity copper sputtering target that does not need to be bonded to a backing plate (BP), and aims to provide a high-purity copper sputtering target capable of forming a thin film having superior uniformity by enhancing the strength (hardness, yield stress) of the flange part of the target, and reducing the amount of warpage of the target. Moreover, the uniformity of the film thickness is improved by adjusting the (111) orientation ratio of the erosion part and the flange part in the target. The present invention thereby aims to provide a high-purity copper sputtering target, which is capable of improving the yield and reliability of semiconductor products that are being subject to further miniaturization and higher integration, and useful for forming a copper alloy wiring for semiconductors.

In order to resolve the foregoing problems, the present invention provides the following invention.

1) A high-purity copper sputtering target, wherein a Vickers hardness of a flange part of the target is in a range of 90 to 100 Hv, a Vickers hardness of an erosion part in the central area of the target is in a range of 55 to 70 Hv, and a crystal grain size of the erosion part is 80 μm or less.

2) A high-purity copper sputtering target, wherein a (111) orientation ratio of a flange part of the target is 20 to 30%, and a (111) orientation ratio of an erosion part in the central area of the target is 57 to 68%.

3) The high-purity copper sputtering target according to 1) above, wherein a (111) orientation ratio of a flange part of the target is 20 to 30%, and a (111) orientation ratio of an erosion part in the central area of the target is 57 to 68%.

4) The high-purity copper sputtering target according to any one of 1) to 3) above, wherein an amount of warpage of the target, after the target is used, is 2.0 mm or less.

5) The high-purity copper sputtering target according to any one of 1) to 4) above, wherein a purity of copper is 99.999% (5N) or higher.

6) The high-purity copper sputtering target according to any one of 1) to 5) above, wherein the target comprises a flange part having a cold worked structure.

7) The high-purity copper sputtering target according to any one of 1) to 6) above, wherein a range of 20 mm to 50 mm from an outer periphery of the target is used as the flange part.

The present invention provides to a high-purity copper sputtering target that does not need to be bonded to a backing plate (BP), and yields a superior effect of being able to provide a high-purity copper sputtering target capable of forming a thin film having superior uniformity by enhancing the strength (hardness, yield stress) of the flange part of the target, and reducing the amount of warpage of the target. Moreover, the uniformity of the film thickness can be improved by adjusting the (111) orientation ratio of the erosion part and the flange part in the target. The present invention can thereby provide a high-purity copper sputtering target, which is capable of improving the yield and reliability of semiconductor products that are being subject to further miniaturization and higher integration, and useful for forming a copper alloy wiring for semiconductors.

In addition, in recent years the need for considering the recycling of the used material is increasing. In comparison to a target that uses a BP material, an integrated target is entirely made from the same material, and therefore an integrated target yields effects in that it can be recycled easily and is economically advantageous.

BRIEF DESCRIPTION OF DRAWINGS

FIG. 1 This is an explanatory diagram of the target.

DETAILED DESCRIPTION

A sputtering target made from high-purity copper having a purity of 99.999% (5N) or higher has weak mechanical properties (strength), and there is a problem in that the sputtering target will become warped during sputtering unless a backing plate (BP) is used. Thus, while there is a method of adding strength by applying processing strain to the target, in this case, the target will have a main orientation of (220) with strain remaining therein, and there is a problem in that the film thickness uniformity becomes inferior.

Thus, in order to simultaneously improve the strength of the target and improve the structure of the target, the present invention adjusts the structure and orientation of the erosion part in the central area of the target through heat treatment, thereafter performs plastic working only to the flange part of the target, and thereby improves the mechanical properties (strength) of the target.

While the size of the flange part of the target will depend on the size of the target, under normal circumstances, a range of roughly 20 to 50 mm from the outer periphery of the target is used as the flange part. This range is a dimension that is implemented in a standard target, and it goes without saying that a target having a flange part outside the foregoing range may also be produced. Moreover, the flange part is not subject to erosion. An explanatory diagram of the target is shown in FIG. 1.

The present invention provides a high-purity copper sputtering target, wherein a Vickers hardness of a flange part of the target is in a range of 90 to 100 Hv, a Vickers hardness of an erosion part in the central area of the target is in a range of 55 to 70 Hv, and a crystal grain size of the erosion part is 80 μm or less.

For a high-purity copper sputtering target, copper having a purity of 99.999% (5N) or higher, or having a purity of 99.9999% (6N) or higher is normally used. It is thereby possible to reduce the warpage of the target during sputtering or after sputtering, and form a thin film with superior uniformity. Note that warpage generally refers to the convexity that occurs on the erosion surface side, and the present invention yields the effect of being able to reduce such warpage.

The present invention can also provide a high-purity copper sputtering target, wherein a (111) orientation ratio of a flange part of the target is 20 to 30%, and a (111) orientation ratio of an erosion part in the central area of the target is 57 to 68%. This orientation ratio has the effect of improving the uniformity of the film thickness. Contrarily, when a (220) orientation with residual processing strain increases, the uniformity of the film thickness tends to deteriorate.

Based on the above, the high-purity copper sputtering target of the present invention can cause the amount of warpage of the target, after the target is used, to be 2.0 mm or less. Since the target deformation can be eliminated, a thin film with superior uniformity can be formed.

The high-purity copper sputtering target is produced by placing high-purity copper having a purity of 5N or higher in a carbon crucible to be subject to melting. The thus obtained molten metal is cast to obtain the high-purity copper ingot of the present invention. Subsequently, the copper ingot is subject to hot forging at a predetermined forging ratio, and thereafter rolled at a predetermined rolling reduction to obtain a copper rolled plate.

The obtained copper rolled plate is further subject to heat treatment at a predetermined temperature for a predetermined time. The thus produced copper rolled plate comprising a recrystallized structure is subject to processing means such as die forging in order to process only the outer peripheral part. Working based on cold forging or the like is preferably performed at a working ratio of 30% or more. Here, strain is prevented from being introduced to the erosion part of the intended target. Accordingly, the flange part will have a cold worked structure. Subsequently, the copper rolled plate is subject to surface finishing via grinding and polishing and further subject to finishing processing in order to produce a sputtering target made from the foregoing high-purity copper.

While the product obtained from the foregoing process is a melt, the product may also be produced as a sintered compact. In the foregoing case, a step of only processing the outer peripheral part using a processing means is essential. Here, strain is prevented from being introduced to the erosion part of the intended target.

As a general rule, the high-purity copper sputtering target produced as described above is not bonded to a backing plate via means such as welding or diffusion bonding.

Since the spent target has no bond part (diffusion part or welding part) with a backing plate, the target is not contaminated and can be recycled easily, and there is a significant advantage in that a high-purity material can be recycled as is.

EXAMPLES

The present invention is now explained based on the Examples. The Examples indicated below are provided for facilitating the understanding of the present invention, and the present invention is not limited by these Examples. In other words, modifications and other examples based on the technical concept of the present invention are also covered by the present invention as a matter of course.

Example 1

High-purity copper (Cu) of purity 6N was melted in a high vacuum atmosphere using a carbon crucible. Molten metal of the copper was casted into a carbon mold in a high vacuum atmosphere to obtain an ingot. Subsequently, the produced ingot was subject to warm forging at 400° C. Subsequently, after a required amount was cut, the cut part was subject to rolling (cold working ratio of 82%) to attain a size of 530 (diameter)×30 (thickness), subject to heat treatment at 300° C. for 1 hour, and a range of 20 mm from the outer periphery was thereafter subject to cold forging (working ratio of 50%).

Subsequently, the obtained product was machined and processed into a target having a target part diameter of 430 mm, and a total thickness of 25 mm. Consequently, the target part had a recrystallized structure of roughly 35 μm, and the flange part became a worked structure based on cold working. In the foregoing case, since the flange part is of a worked structure, the crystal grain size cannot be confirmed.

With regard to the high-purity copper sputtering target produced as described above, the hardness (Vickers hardness Hv) of the flange part, the (111) orientation ratio (%) of the erosion part, and the crystal grain size (μm) were examined.

Consequently, the hardness of the flange part was 100 Hv, the (111) orientation ratio of the erosion part was 65.5%, and the crystal grain size was 35 μm. The results are shown in Table 1.

Subsequently, sputtering was performed using this target. The maximum warpage of the target after sputtering was 0.8 mm, and the result improved remarkably in comparison to the Comparative Examples described later. Moreover, the uniformity of the deposited film was 2.1%, and the film thickness uniformity showed favorable results.

Note that, Table 1 shows the results of simultaneously evaluating the hardness (Hv) of the flange part, the (111) orientation ratio (%) of the erosion part, and the crystal grain size (μm). However, even when these items were evaluated individually, similar results were obtained regarding the maximum warpage of the target after sputtering and the uniformity of the deposited film.

TABLE 1

| | Working ratio of flange part (%) | Hardness of flange part (Hv) | Shore hardness of flange part | (111) orientation ratio of flange part (%) | Hardness of erosion part (Hv) | (111) orientation ratio of erosion part (%) | Crystal grain size of erosion part (μm) | Amount of warpage (mm) | Uniformity (life average) (%) |
|---|---|---|---|---|---|---|---|---|---|
| Example 1 | 50 | 100 | 19 | 29.7 | 67 | 65.5 | 35 | 0.8 | 2.1 |
| Example 2 | 40 | 95 | 18 | 25.8 | 65 | 64.3 | 40 | 1.3 | 2.2 |
| Example 3 | 40 | 95 | 18 | 23.3 | 65 | 67.1 | 40 | 1.2 | 2.3 |
| Example 4 | 30 | 90 | 17 | 20.2 | 61 | 68.3 | 80 | 1.6 | 2.5 |
| Comparative Example 1 | 0 | 58 | 8 | 66.5 | 58 | 66.3 | 120 | 4.2 | 3.8 |
| Comparative Example 2 | 10 | 63 | 9 | 46.2 | 63 | 68.1 | 70 | 3.6 | 3.3 |
| Comparative Example 3 | 10 | 65 | 9 | 45.9 | 65 | 67.2 | 45 | 3.5 | 3.6 |
| Comparative Example 4 | 20 | 68 | 10 | 38.4 | 68 | 65.3 | 35 | 3.3 | 3.7 |

Example 2

High-purity copper (Cu) of purity 6N was melted in a high vacuum atmosphere using a carbon crucible. Molten metal of the copper was casted into a carbon mold in a high vacuum atmosphere to obtain an ingot.

Subsequently, the produced ingot was subject to warm forging at 400° C. Subsequently, after a required amount was cut, the cut part was subject to rolling (cold working ratio of 80%) to attain a size of 530 (diameter)×30 (thickness), subject to heat treatment at 325° C. for 1 hour, and a range of 30 mm from the outer periphery was thereafter subject to cold forging (working ratio of 40%). Subsequently, the obtained product was machined and processed into a target having a target part diameter of 430 mm, and a total thickness of 25 mm.

With regard to the high-purity copper sputtering target produced as described above, the hardness (Vickers hardness Hv) of the flange part, the (111) orientation ratio (%) of the erosion part, and the crystal grain size (μm) were examined.

Consequently, the hardness of the flange part was 95 Hv, the (111) orientation ratio of the erosion part was 64.3%, and the crystal grain size was 40 μm. The results are shown in Table 1.

Subsequently, sputtering was performed using this target. The maximum warpage of the target after sputtering was 1.3 mm, and the result improved remarkably in comparison to the Comparative Examples described later. Moreover, the uniformity of the deposited film was 2.2%, and the film thickness uniformity showed favorable results.

Note that, Table 1 shows the results of simultaneously evaluating the hardness (Hv) of the flange part, the (111) orientation ratio (%) of the erosion part, and the crystal grain size (μm). However, even when these items were evaluated individually, similar results were obtained regarding the maximum warpage of the target after sputtering and the uniformity of the deposited film.

Example 3

High-purity copper (Cu) of purity 6N was melted in a high vacuum atmosphere using a carbon crucible. Molten metal of the copper was casted into a carbon mold in a high vacuum atmosphere to obtain an ingot. Subsequently, the produced ingot was subject to warm forging at 400° C. Subsequently, after a required amount was cut, the cut part was subject to rolling (cold working ratio of 80%) to attain a size of 530 (diameter)×30 (thickness), subject to heat treatment at 325° C. for 1 hour, and a range of 40 mm from the outer periphery was thereafter subject to cold forging (working ratio of 40%). Subsequently, the obtained product was machined and processed into a target having a target part diameter of 430 mm, and a total thickness of 25 mm.

With regard to the high-purity copper sputtering target produced as described above, the hardness (Vickers hardness Hv) of the flange part, the (111) orientation ratio (%) of the erosion part, and the crystal grain size (μm) were examined.

Consequently, the hardness of the flange part was 95 Hv, the (111) orientation ratio of the erosion part was 67.1%, and the crystal grain size was 40 μm. The results are shown in Table 1.

Subsequently, sputtering was performed using this target. The maximum warpage of the target after sputtering was 1.2 mm, and the result improved remarkably in comparison to the Comparative Examples described later. Moreover, the uniformity of the deposited film was 2.3%, and the film thickness uniformity showed favorable results.

Note that, Table 1 shows the results of simultaneously evaluating the hardness (Hv) of the flange part, the (111) orientation ratio (%) of the erosion part, and the crystal grain size (μm). However, even when these items were evaluated individually, similar results were obtained regarding the maximum warpage of the target after sputtering and the uniformity of the deposited film.

Example 4

High-purity copper (Cu) of purity 6N was melted in a high vacuum atmosphere using a carbon crucible. Molten metal of the copper was casted into a carbon mold in a high vacuum atmosphere to obtain an ingot. Subsequently, the produced ingot was subject to warm forging at 400° C. Subsequently, after a required amount was cut, the cut part was subject to rolling (cold working ratio of 78%) to attain a size of 530 (diameter)×30 (thickness), subject to heat treatment at 350° C. for 1 hour, and a range of 50 mm from the outer periphery was thereafter subject to cold forging (working ratio of 30%). Subsequently, the obtained product was machined and processed into a target having a target part diameter of 430 mm, and a total thickness of 25 mm.

With regard to the high-purity copper sputtering target produced as described above, the hardness (Vickers hardness Hv) of the flange part, the (111) orientation ratio (%) of the erosion part, and the crystal grain size (μm) were examined.

Consequently, the hardness of the flange part was 90 Hv, the (111) orientation ratio of the erosion part was 68.3%, and the crystal grain size was 80 μm. The results are shown in Table 1.

Subsequently, sputtering was performed using this target. The maximum warpage of the target after sputtering was 1.6 mm, and the result improved remarkably in comparison to the Comparative Examples described later. Moreover, the uniformity of the deposited film was 2.5%, and the film thickness uniformity showed favorable results.

Note that, Table 1 shows the results of simultaneously evaluating the hardness (Hv) of the flange part, the (111) orientation ratio (%) of the erosion part, and the crystal grain size (μm). However, even when these items were evaluated individually, similar results were obtained regarding the maximum warpage of the target after sputtering and the uniformity of the deposited film.

Comparative Example 1

High-purity copper (Cu) of purity 6N was melted in a high vacuum atmosphere using a carbon crucible. Molten metal of the copper was casted into a carbon mold in a high vacuum atmosphere to obtain an ingot. Subsequently, the produced ingot was subject to warm forging at 400° C. Subsequently, after a required amount was cut, the cut part was subject to rolling (cold working ratio of 78%) to attain a size of 530 (diameter)×30 (thickness), subject to heat treatment at 375° C. for 1 hour, and the obtained product was machined and processed into a target having a target part diameter of 430 mm, and a total thickness of 25 mm.

With regard to the high-purity copper sputtering target produced as described above, the hardness (Vickers hardness Hv) of the flange part, the (111) orientation ratio (%) of the erosion part, and the crystal grain size (μm) were examined.

Consequently, the hardness of the flange part was 58 Hv, the (111) orientation ratio of the erosion part was 66.3%, and the crystal grain size was 120 μm. The results are shown in Table 1.

Subsequently, sputtering was performed using this target. The maximum warpage of the target after sputtering was 4.2 mm, and the result deteriorated in comparison to the Examples. Moreover, the uniformity of the deposited film was 3.8%, and the film thickness uniformity also deteriorated.

Comparative Example 2

High-purity copper (Cu) of purity 6N was melted in a high vacuum atmosphere using a carbon crucible. Molten metal of the copper was casted into a carbon mold in a high vacuum atmosphere to obtain an ingot. Subsequently, the produced ingot was subject to warm forging at 400° C. Subsequently, after a required amount was cut, the cut part was subject to rolling (cold working ratio of 78%) to attain a size of 530 (diameter)×30 (thickness), subject to heat treatment at 350° C. for 1 hour, and a range of 30 mm from the outer periphery was thereafter subject to cold forging (working ratio of 10%). Subsequently, the obtained product was machined and processed into a target having a target part diameter of 430 mm, and a total thickness of 25 mm.

With regard to the high-purity copper sputtering target produced as described above, the hardness (Vickers hardness Hv) of the flange part, the (111) orientation ratio (%) of the erosion part, and the crystal grain size (μm) were examined.

Consequently, the hardness of the flange part was 63 Hv, the (111) orientation ratio of the erosion part was 68.1%, and the crystal grain size was 70 μm. The results are shown in Table 1.

Subsequently, sputtering was performed using this target. The maximum warpage of the target after sputtering was 3.6 mm, and the result deteriorated in comparison to the Examples. Moreover, the uniformity of the deposited film was 3.3%, and the film thickness uniformity also deteriorated.

Comparative Example 3

High-purity copper (Cu) of purity 6N was melted in a high vacuum atmosphere using a carbon crucible. Molten metal of the copper was casted into a carbon mold in a high vacuum atmosphere to obtain an ingot. Subsequently, the produced ingot was subject to warm forging at 400° C. Subsequently, after a required amount was cut, the cut part was subject to rolling (cold working ratio of 80%) to attain a size of 530 (diameter)×30 (thickness), subject to heat treatment at 325° C. for 1 hour, and a range of 40 mm from the outer periphery was thereafter subject to cold forging (working ratio of 10%). Subsequently, the obtained product was machined and processed into a target having a target part diameter of 430 mm, and a total thickness of 25 mm.

With regard to the high-purity copper sputtering target produced as described above, the hardness (Vickers hardness Hv) of the flange part, the (111) orientation ratio (%) of the erosion part, and the crystal grain size (μm) were examined.

Consequently, the hardness of the flange part was 65 Hv, the (111) orientation ratio of the erosion part was 67.2%, and the crystal grain size was 45 μm. The results are shown in Table 1.

Subsequently, sputtering was performed using this target. The maximum warpage of the target after sputtering was 3.5 mm, and the result deteriorated in comparison to the Examples. Moreover, the uniformity of the deposited film was 3.6%, and the film thickness uniformity also deteriorated.

Comparative Example 4

High-purity copper (Cu) of purity 6N was melted in a high vacuum atmosphere using a carbon crucible. Molten metal of the copper was casted into a carbon mold in a high vacuum atmosphere to obtain an ingot. Subsequently, the produced ingot was subject to warm forging at 400° C. Subsequently, after a required amount was cut, the cut part was subject to rolling (cold working ratio of 82%) to attain a size of 530 (diameter)×30 (thickness), subject to heat treatment at 300° C. for 1 hour, and a range of 50 mm from the outer periphery was thereafter subject to cold forging (working ratio of 20%). Subsequently, the obtained product was machined and processed into a target having a target part diameter of 430 mm, and a total thickness of 25 mm.

With regard to the high-purity copper sputtering target produced as described above, the hardness (Vickers hardness Hv) of the flange part, the (111) orientation ratio (%) of the erosion part, and the crystal grain size (μm) were examined.

Consequently, the hardness of the flange part was 68 Hv, the (111) orientation ratio of the erosion part was 65.3%, and the crystal grain size was 35 μm. The results are shown in Table 1.

Subsequently, sputtering was performed using this target. The maximum warpage of the target after sputtering was 3.3 mm, and the result deteriorated in comparison to the Examples. Moreover, the uniformity of the deposited film was 3.7%, and the film thickness uniformity also deteriorated.

The present invention provides to a high-purity copper sputtering target that does not need to be bonded to a backing plate (BP), and yields a superior effect of being able to provide a high-purity copper sputtering target capable of forming a thin film having superior uniformity by enhancing the strength (hardness) of the flange part of the target, and reducing the amount of warpage of the target. Moreover, the uniformity of the film thickness can be improved by adjusting the (111) orientation ratio of the erosion part and the flange part in the target. The present invention can thereby provide a high-purity copper sputtering target, which is capable of improving the yield and reliability of semiconductor products that are being subject to further miniaturization and higher integration, and useful for forming a copper alloy wiring for semiconductors.

In addition, in recent years the need for considering the recycling of the used material is increasing. In comparison to a target that uses a BP material, an integrated target is entirely made from the same material, and therefore an integrated target yields effects in that it can be recycled easily and is economically advantageous.

The invention claimed is:

1. A high-purity copper sputtering target, the target being plate-shaped and consisting of copper having a purity of 99.999% (5N) or higher and having an erosion part in a central area of the target and a flange part forming an outer periphery of the target, wherein a (111) orientation ratio of the flange part of the target is 20 to 30%, and a (111) orientation ratio of the erosion part of the target is 57 to 68%, wherein a Vickers hardness of the flange part of the target is in a range of 90 to 100 Hv, a Vickers hardness of the erosion part of the target is in a range of 55 to 70 Hv, and a crystal grain size of the erosion part is 80 pm or less.

2. The high-purity copper sputtering target according to claim 1, wherein an amount of warpage of the target, after the target is used, is 2.0 mm or less.

3. The high-purity copper sputtering target according to claim 2, wherein the flange part of the target is a cold worked structure.

4. The high-purity copper sputtering target according to claim 3, wherein the flange part extends 20 mm to 50 mm from an outer peripheral edge of the target toward the erosion part of the target.

5. The high-purity copper sputtering target according to claim 1, wherein the flange part is a cold worked structure.

6. The high-purity copper sputtering target according to claim 1, wherein the flange part extends 20 mm to 50 mm from an outer peripheral edge of the target toward the erosion part of the target.

7. The high-purity copper sputtering target according to claim 1, wherein the Vickers hardness of the erosion part of the target is in the range of 55 to less than 70 Hv.

8. The high-purity copper sputtering target according to claim 1, wherein the Vickers hardness of the erosion part of the target is in the range of 55 to 67 Hv.

9. The high-purity copper sputtering target according to claim 1, wherein the Vickers hardness of the erosion part of the target is in the range of 61 to 67 Hv.

* * * * *